(12) United States Patent
Griswold et al.

(10) Patent No.: US 8,558,546 B2
(45) Date of Patent: Oct. 15, 2013

(54) RELAXOMETRY

(76) Inventors: Mark Griswold, Shaker Heights, OH (US); Nicole Seiberlich, Shaker Heights, OH (US); Dan Ma, Cleveland Heights, OH (US)

( * ) Notice: Subject to any disclaimer, the term of this patent is extended or adjusted under 35 U.S.C. 154(b) by 364 days.

(21) Appl. No.: 13/085,690

(22) Filed: Apr. 13, 2011

(65) Prior Publication Data

US 2012/0262165 A1 Oct. 18, 2012

(51) Int. Cl.
*G01V 3/00* (2006.01)

(52) U.S. Cl.
USPC .................................. 324/309; 324/318

(58) Field of Classification Search
USPC .................. 324/300–322; 600/407–445
See application file for complete search history.

(56) References Cited

U.S. PATENT DOCUMENTS

| | | | |
|---|---|---|---|
| 6,430,430 B1 * | 8/2002 | Gosche | 600/410 |
| 7,816,918 B2 * | 10/2010 | Bottomley et al. | 324/318 |
| 8,004,281 B2 * | 8/2011 | Bottomley et al. | 324/318 |
| 8,012,464 B2 * | 9/2011 | Rosen et al. | 424/85.1 |
| 8,150,128 B2 * | 4/2012 | Konofagou et al. | 382/131 |
| 2011/0037468 A1 * | 2/2011 | Bottomley et al. | 324/313 |
| 2012/0235678 A1 * | 9/2012 | Seiberlich et al. | 324/307 |
| 2012/0262166 A1 * | 10/2012 | Griswold et al. | 324/309 |
| 2012/0268123 A1 * | 10/2012 | Griswold et al. | 324/309 |

OTHER PUBLICATIONS

Schmitt, et al., Inversion Recovery TrueFISP: Quantification of T1, T2, and Spin Density, Magnetic Resonance in Medicine 51:661-667 (2004), Published online in Wiley InterScience (www.interscience.wiley.com). 2004 Wiley-Liss, Inc.

* cited by examiner

*Primary Examiner* — Brij Shrivastav

(57) ABSTRACT

Apparatus, methods, and other embodiments associated with multi-scale orthogonal matching pursuit (OMP) for magnetic resonance imaging (MRI) relaxometry are described. One example method includes controlling a nuclear magnetic resonance (NMR) apparatus to cause selected nuclei in an item to resonate by applying radio frequency (RF) energy to the item and then acquiring multiple series of magnetic resonance (MR) images of the item, the series of MR images having different scales. The example method includes controlling the NMR apparatus to produce a combined signal evolution from a first signal evolution associated with a first series of MR images and a second signal evolution associated with a second series of MR images and to characterize relaxation of the selected nuclei in the item as a function of an OMP that compares the combined signal evolution to a set of combined comparative signal evolutions.

19 Claims, 12 Drawing Sheets

RELAXOMETRY

BACKGROUND

Magnetic resonance imaging relaxometry (MRIR) concerns the measurement of relaxation rates of spins that were excited by nuclear magnetic resonance (NMR). MRIR is based on the physical aspects of nuclei relaxing to the ground state after being excited by radio frequency (RF) energy associated with, for example, a spin inversion recovery sequence. To generate a "map" of relaxation rates (e.g., R2=1/T2) or of relaxation times (e.g., T1, T2), at least two magnetic resonance (MR) images are acquired. The sensitivity of the relaxometry technique depends on factors including, but not limited to, sequence, repetition time (TR), echo time (TE), the number of images acquired with different TE, the model adopted for fitting the acquired data, and so on. Conventional techniques have faced many challenges including accuracy and processing time.

MRIR is the process of recovering a map of relaxation parameters from the time sample of the spin signal for pixels in an MR image. Conventionally, MRIR has involved substantial computation that may have lead to unacceptably long parameter determination times. The long computation times have been associated with conventional mathematical approaches to solving the spin relaxometry inverse problem. In addition to taking a long time, the conventional approaches may have yielded inaccurate results.

Conventional mathematical techniques used in MRIR first considered that when an inversion recovery sequence is applied, the ideal value of a pixel's signal S at a time t is described by:

$$S(t) = \rho(1 - 2e^{-xt})$$

where
$\rho$=spin density,
x=spin relaxation rate in $\sec^{-1}$, and
t=time in seconds.

However, since a pixel may represent several types of tissue, and since tissue types may have their own spin density (p) and their own spin relaxation rate (x), the ideal signal may better described by:

$$S(t) = \sum_j \rho_j (1 - 2e^{-x_j t})$$

where j covers the different tissue types in the sample.

Even this representation of the S(t) equation may be unsatisfactory because this representation unnaturally assumes that relaxation rates for spins in tissue are unique and distinct with sharp demarcations. It is more likely that spins exhibiting a range of relaxation rates clustered around a central value(s) will be encountered. Therefore, spin density (p) may be more of a continuous function and less of a discrete function. When the continuous function approach is observed, then S(t) may be even more realistically described by:

$$S(t) = \int \rho(x)(1 - 2e^{-xt}) dx$$

This representation would yield an idealized curve like curve 400 that is illustrated in FIG. 4. However, due to measurement noise and other factors, an actual input curve may be more like curve 500 that is illustrated in FIG. 5. The idealized curve 400 and the actual curve 500 illustrate that MRIR will involve processing the noisy MRI signal (e.g., curve 500) and deriving the spin spectrum that generated the signal. This is known as an inverse problem because it involves working backwards from an observed S(t) to determine the actual input $\rho(x)$.

Attempts at solving the inverse problem for MRIR have been described as early as 1982. These early attempts report consuming up to 58 hours to solve the inverse problem for one 64×64 pixel image. While interesting from a theoretical mathematical perspective, 58 hours may not be a clinically relevant time frame. Thus, subsequent approaches attempted to speed up the calculations.

One subsequent approach involved applying parallel computing techniques to a Tikhonov regularization process for solving the inverse problem. Tikhonov regularization involves approximating a continuous integral as a discrete summation. Computations associated with the discrete summation may be parallelizable. Some subsequent attempts even progressed into constrained linear regularization. However, all of these subsequent approaches required some heuristic for selecting a trade off parameter for the regularization method. Ultimately, choosing a satisfactory trade-off parameter depended on having available the original spin spectrum for comparison. Unfortunately, in solving an MRIR inverse problem, the original spin spectrum is not available. Thus, computation times and accuracy continued to languish.

MRIR involves mapping the relaxation parameters for items (e.g., tissues) that have been excited using nuclear magnetic resonance (NMR). MRIR may produce relaxation parameter maps having pixel-wise parameter values for parameters including, but not limited to, T1 (spin-lattice relaxation), T2 (spin-spin relaxation), and spin density (M0) relaxation. Conventionally, these pixel-wise values may have been exploited in sub-optimal ways. One sub-optimal result was due to issues associated with performing conventional sliding window image reconstruction before performing relaxation parameter fitting. Another sub-optimal result was due to issues associated with performing conventional orthogonal matching pursuit (OMP) where dictionary entries were overly homogenous, particularly in the initial portion of a relaxation curve.

Recent advances in quantitative MRI data acquisition have facilitated, for under-sampled acquisitions, simultaneously determining multiple relaxation parameters but have yet to provide satisfactory treatment of the inverse problem. For example, Schmitt, et al., *Inversion Recovery TrueFISP: Quantification of T1, T2, and Spin Density*, Magn Reson Med 2004, 51:661-667, describe extracting multiple relaxation parameters from a signal time course sampled with a series of TrueFISP images after spin inversion. TrueFISP imaging refers to true fast imaging with steady state precession. TrueFISP is a coherent technique that uses a balanced gradient waveform. In TrueFISP, image contrast is determined by T2*/T1 properties mostly depending on repetition time (TR). As gradient hardware has improved, minimum TRs have been reduced. Additionally, as field shimming has improved, signal to noise ratio has improved making TrueFISP suitable for whole-body applications, for cardiac imaging, for brain tumor imaging, and for other applications. While this represents a significant advance in simultaneously acquiring pixel-wise values, the inverse problem remains an issue.

In another example, Twieg, *Parsing local signal evolution directly from a single-shot MRI signal: a new approach for fMRI*, Magn Reson Med 2003, November; 50(5):1043-52, describes a single-shot MRI method that performs single-shot parameter assessment by retrieval from signal encoding. Once again, data acquisition is improved, but the inverse problem remains. Doneva, et al., *Compressed sensing reconstruction for magnetic resonance parameter mapping*, Magn Reson Med 2010, Volume 64, Issue 4, pages 1114-1120 take one approach to the inverse problem. Doneva describes a dictionary based approach for parameter estimating. Doneva applies a learned dictionary to sparsify data and then uses a model based reconstruction for MR parameter mapping. Doneva identifies that "multiple relaxation components in a heterogeneous voxel can be assessed." The success of this approach depends heavily on the learned dictionary. However, the Doneva library is limited to the idealized, single relaxation parameter curves because the preparation is specific and constrained by the fact that Doneva ultimately reconstructs an image from the acquired data. This constraint may yield a dictionary with overly homogenous relaxation curves against which input curves are to be fit or matched.

Yutzy S et al., *Proc ISMRM* 17 (2009), Pg. 2765 and Ehses P et al., *Proc ISMRM* 18 (2010) Pg. 2969, describe curve fitting based approaches for parameter estimating to solve the inverse problem. These approaches diverge from earlier approaches like those described by Carneiro, et al., *MRI Relaxometry, Methods and Applications*, Brazilian Journal of Physics, vol. 36, no. 1A, March 2006, which reported that "generally, T2 has been evaluated using single or bi-exponential fitting", which lead to "the value of T2 obtained from an exponential fit [being] strongly influenced by the choice of the amplitude of the signal offset." In some instances, both the single scale OMP and the bi-exponential fitting have yielded unsatisfactory results for the inverse problem.

Thus, even though more and more pixel-wise relaxation parameter data is becoming available, and even though that data is becoming available in ever shorter, more clinically relevant time frames, the data may still be under-utilized in conventional fitting approaches, even OMP approaches, that attempt to solve the inverse problem.

One conventional OMP technique may yield inaccurate results due to similarities between relaxation curves in the OMP dictionary. Recall that OMP involves matching or fitting acquired signal evolutions to dictionary relaxation curves to try to determine the best match or fit and thus to try to determine the relaxation parameter values. Conventionally, similarities between dictionary relaxation curves has made it difficult, if even possible at all, to identify a best match. In other words, when things in the dictionary are too similar, it is hard to use the dictionary to uniquely identify and disambiguate incoming signal evolutions because the incoming signal evolutions either match or do not match to the similar things in similar ways. This issue may be exacerbated when the incoming signal evolutions are associated with an under-sampled data space and have fewer points for comparison.

The short comings of conventional approaches have lead to a difficult decision concerning tradeoffs between high degrees of under-sampling and image quality. When items are relaxing very quickly, images may need to be highly under-sampled to catch fast relaxation components. However, the high under-sampling may lead to very noisy signal curves that are difficult to process and lead to lower quality images. However, when items are relaxing more slowly, high degrees of under-sampling may not be required and higher quality images may be acquired. Conventionally, imagers must balance the desire to catch fast relaxation components against the desire to have the highest quality images. With fewer images (e.g., higher under-sampling), the ability to track dynamic information is limited. Therefore, there is a tradeoff between image quality and the ability to track dynamic information. Using fewer projections allows making more images of lower quality but with higher ability to track dynamic information. Using more projections allows making fewer images of higher quality but with less ability to track dynamic information.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods process signal evolutions associated with combinations of series of differently scaled images acquired in response to NMR excitation. In one example, the signal evolutions are matched or fit to combined comparative multi-scale signal evolutions using orthogonal matching pursuit (OMP). In different embodiments, the combined comparative signal evolutions can be derived from previously acquired signals or may be crafted from simulated evolutions.

In one embodiment, an MRI apparatus is configured to acquire data and to produce two or more series of images. The different series of images will have different scales for an MRI parameter. The MRI parameter can include, for example, number of projections, degree of under-sampling, trajectory, and so on. In one example, signal evolutions will be acquired for the different series of images and the signal evolutions later combined into different combined signal evolutions. The combination may take forms including, but not limited to, concatenation, registering, and so on.

Figure 1:
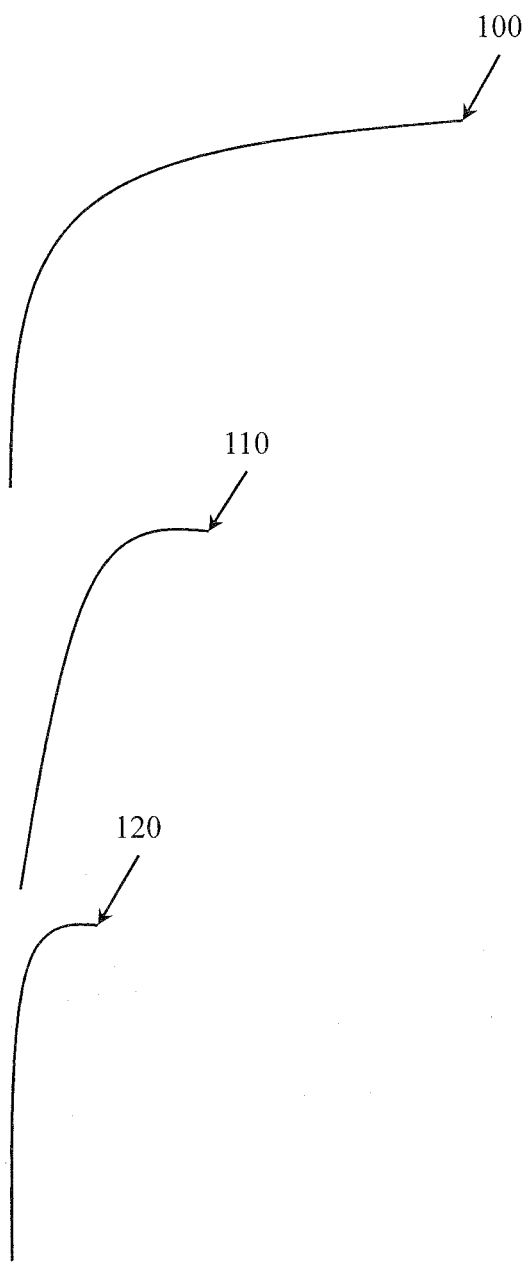
FIG. 1 illustrates three separate relaxation curves.

FIG. 1 illustrates three separate signal evolutions associated with three different series of images that were acquired with different scales. In FIG. 1, the different scale concerns the number of projections per image. In FIG. 1, signal evolution 100 is associated with a series of images that was acquired using two projections, signal evolution 110 is associated with a series of images that was acquired using forty projections, and signal evolution 120 is associated with a series of images that was acquired using eighty projections. One skilled in the art will understand that MR data may be acquired from an item. That data can then be combined in different ways to make different series of images. For example, a first series of images may be produced using two projections per image. This may produce a large number of low quality images. However, dynamic information (e.g., information that is changing between images) may be readily tracked. A second series of images may be produced using, for example, four projections per image. This may produce half as many images that are still low quality. However, dynamic information may still be readily tracked. A third series of images may be produced using, for example, half of the available projections per image. This would produce two high quality images. However, with only two images, the ability to track dynamic information is limited. Therefore, there is a tradeoff between image quality and the ability to track dynamic information. Using fewer projections allows making more images of lower quality but with higher ability to track dynamic information. Using more projections allows making fewer images of higher quality but with less ability to track dynamic information.

Figure 2:
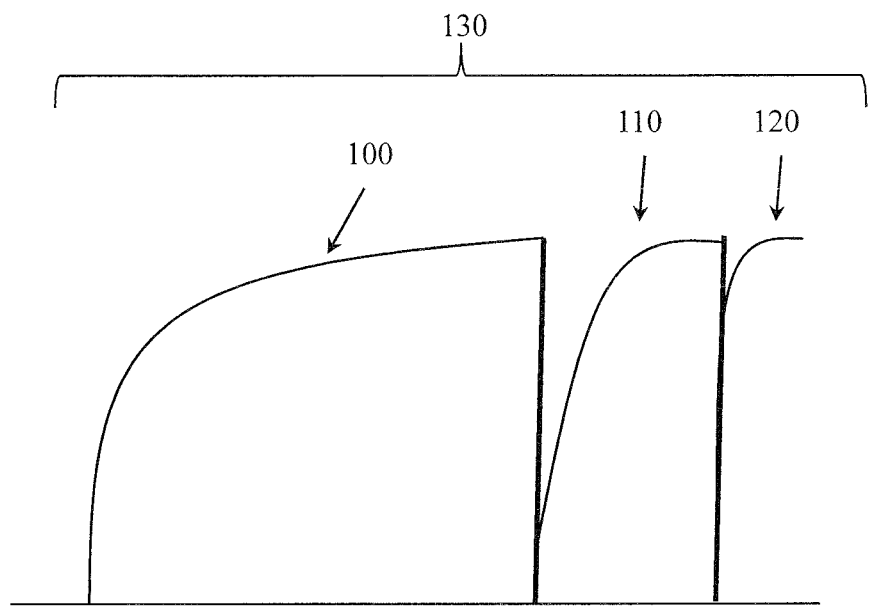
FIG. 2 illustrates three separate relaxation curves combined into a single relaxation curve.
Figure 3:
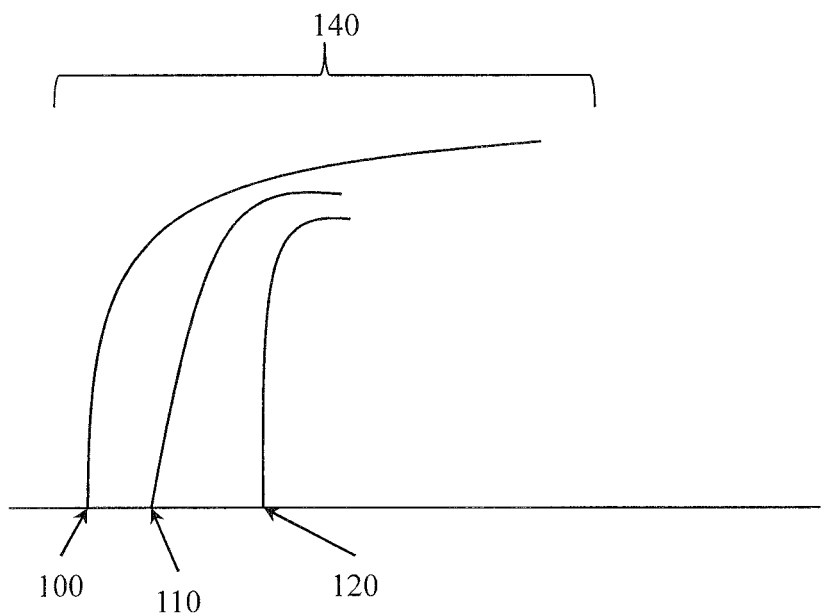
FIG. 3 illustrates three separate relaxation curves combined into a single relaxation curve.
Figure 4:
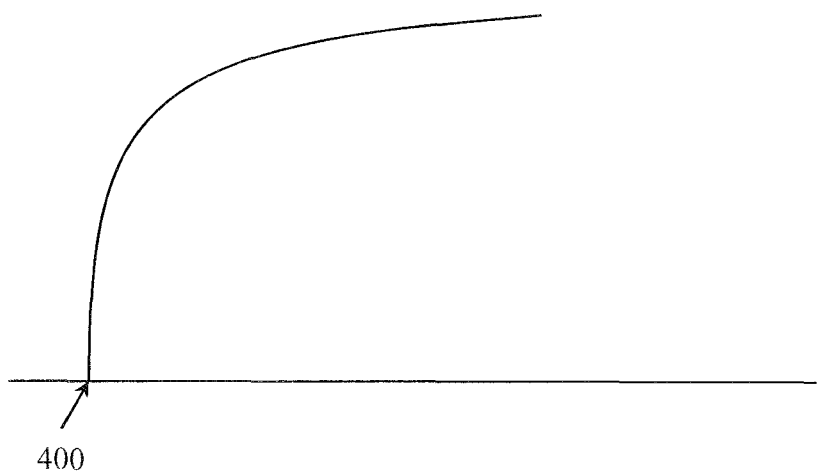
FIG. 4 illustrates an idealized relaxation curve.
Figure 5:
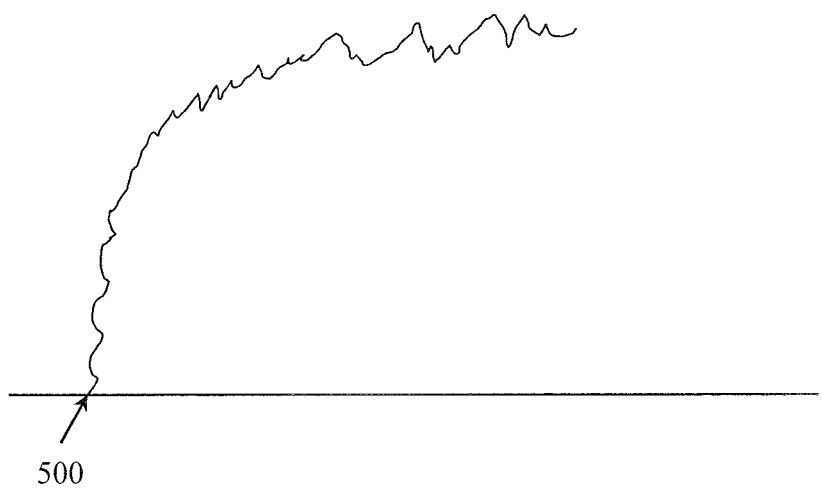
FIG. 5 illustrates an actual relaxation curve.

FIG. 2 illustrates a combination 130 of signal evolutions 100, 110 and 120. Combination 130 represents a concatenation of signal evolutions 100, 110, and 120. FIG. 3 illustrates a different combination 140 of signal evolutions 100, 110, and 120. Combination 140 represents an overlay (e.g., registration) of signal evolutions 100, 110, and 120. One skilled in the art will appreciate that there are different ways to combine signal evolutions. One goal for combining images and/or signal evolutions associated with images is to produce patterns that can be matched to a more heterogeneous dictionary of patterns.

After the combined signal evolution has been produced, then the combined signal evolution can be compared to combined comparative signal evolutions. The combined comparative signal evolutions will have been prepared to account for the combinatorial method employed to combine the two or more signal evolutions.

One conventional quantitative MRI data acquisition technique facilitates simultaneously determining multiple relaxation parameters using relatively long acquisition times of up to three minutes per slice. The relatively lengthy acquisition time may be needed to allow for segmenting the data acquisition to fully capture the relaxation curve for the full k-space. However, the relative lengthy acquisition time may be unacceptably long for some uses. Thus attempts to shorten the acquisition time have been made.

Another relaxation parameter determination technique avoids the lengthy acquisition time by under-sampling the relaxation data and then performing curve fitting or a dictionary based technique like OMP. The under-sampling may refer to under-sampling in space and/or time. Conventional OMP may rely on a dictionary that was built using single scale data. For example, the dictionary may have been built using a single timing vector. This may be referred to as single scale OMP. Single scale OMP is susceptible to inaccurate parameter value estimations when the input data is noisy, particularly when the dictionary entries are overly homogenous (e.g., similar to each other). Simply adding more single scale dictionary entries that are more dissimilar and less homogenous may not yield improved results because only the original overly homogenous curves may be relevant to the input data.

Therefore, instead of adding more single scale dictionary entries, example systems and methods make a fundamental change to both the dictionary entries and to how the input data is fit to the dictionary entries. The fundamental change involves combining multiple entries associated with multiple scales. In one example, two entries having two different scales may be combined. In another example, three entries having three different scales may be combined. In other examples, four or more entries having four or more different scales may be combined. In different examples the combinations may include, but are not limited to, concatenations and registrations. The combined dictionary entries are then available for fitting or matching input signal evolutions that are themselves associated with combined images or combined signal evolutions.

Relaxation equations are known for different tissues and excitation schemes. For example, model IR-TrueFISP T1 relaxation equations and model IR-TrueFISP T2 relaxation equations are known. Thus, simulated signal evolutions can be computed at different scales using the known relaxation equations. The simulated signal evolutions can then be combined in various ways to create more heterogeneous dictionary entries that facilitate improved multi-scale OMP. In one embodiment, dictionary entries may be added until a desired level of heterogeneity is achieved. The desired level of heterogeneity may be controlled by the number of different scales. In another embodiment, dictionary entries may be added until a desired coverage range of possible curves is achieved.

In one embodiment, two or more dictionaries may be constructed and/or accessed. A first dictionary may include entries that represent concatenated signal evolutions. A second dictionary may include entries that represent registered signal evolutions. Additional dictionaries associated with different combinatorial approaches may also be built and/or accessed. Thus, when series of images are acquired using different scales, signal evolutions associated with those series of images can be combined in different ways and matching (e.g., OMP) can be performed in parallel on the acquired signal evolutions and corresponding comparative signal evolutions. In one embodiment, a final parameter mapping may consider results achieved from different matchings (e.g., OMPs) performed in parallel.

Figure 6:
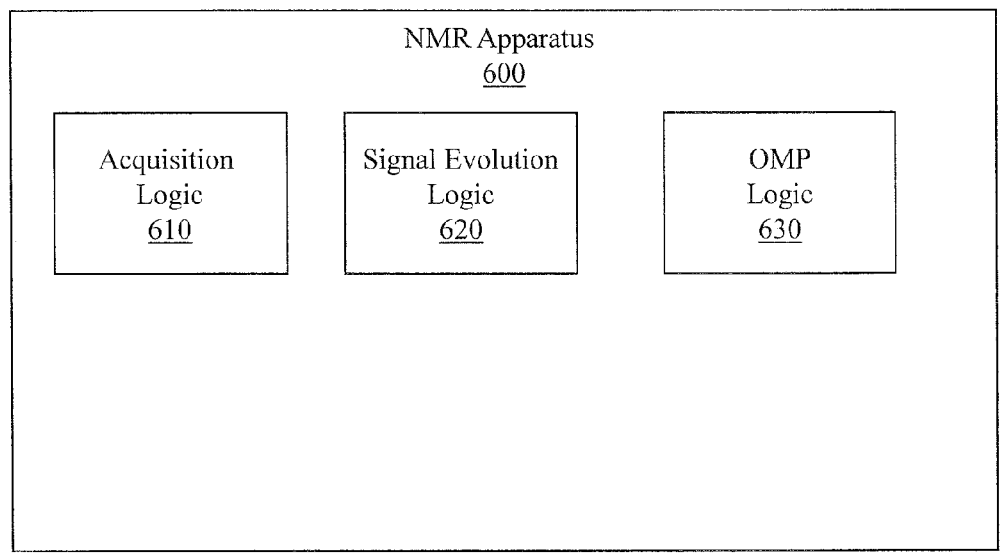
FIG. 6 illustrates an example apparatus associated with multi-scale OMP for MRIR.

FIG. 6 illustrates an NMR apparatus 600. Apparatus 600 includes an acquisition logic 610, a signal evolution logic 620, and an OMP logic 630.

In one example, the acquisition logic 610 is configured to acquire a first series of MR images having a first scale and to acquire a second series of MR images having a second, different scale. The first series of MR images and the second series of MR images are acquired in response to (e.g., after) NMR excitation of an item. The item may be, for example, a region in a patient. In one example, the first scale and the second scale may concern attributes including, but not limited to, a number of projections per image, a degree of under-sampling, and an NMR signal acquisition strategy.

In one example, the signal evolution logic 620 is configured to produce a combined signal evolution. The combined signal evolution represents a first signal evolution associated with the relaxation of nuclei as identified in the first series of images and a second signal evolution associated with the relaxation of nuclei as identified in the second series of images. In one example, signal evolutions may be acquired from the first series of MR images and second series of MR images and then combined.

In one example, the OMP logic 630 is configured to compute a value for an NMR relaxation parameter for the item by comparing the combined signal evolution to a set of combined comparative signal evolutions. In one example, the NMR relaxation parameter can include, but is not limited to, spin-lattice relaxation (T1), spin-spin relaxation (T2), and spin density relaxation (M0). While an OMP logic 630 is described, more generally a matching logic may be employed.

Figure 7:
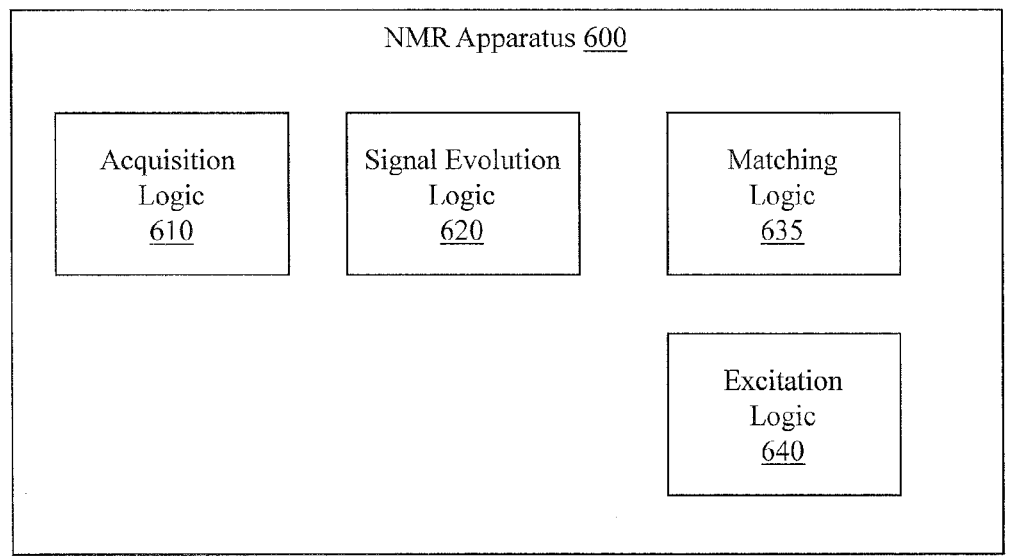
FIG. 7 illustrates an example apparatus associated with multi-scale OMP for MRIR.

FIG. 7 illustrates another embodiment of NMR apparatus 600. This embodiment includes the acquisition logic 610, the signal evolution logic 620, a matching logic 635, and also includes an excitation logic 640. The excitation logic 640 is configured to perform NMR excitation of the item. Thus, the excitation logic 640 may control an NMR apparatus to perform an IR TrueFISP excitation and acquisition.

Figure 8:
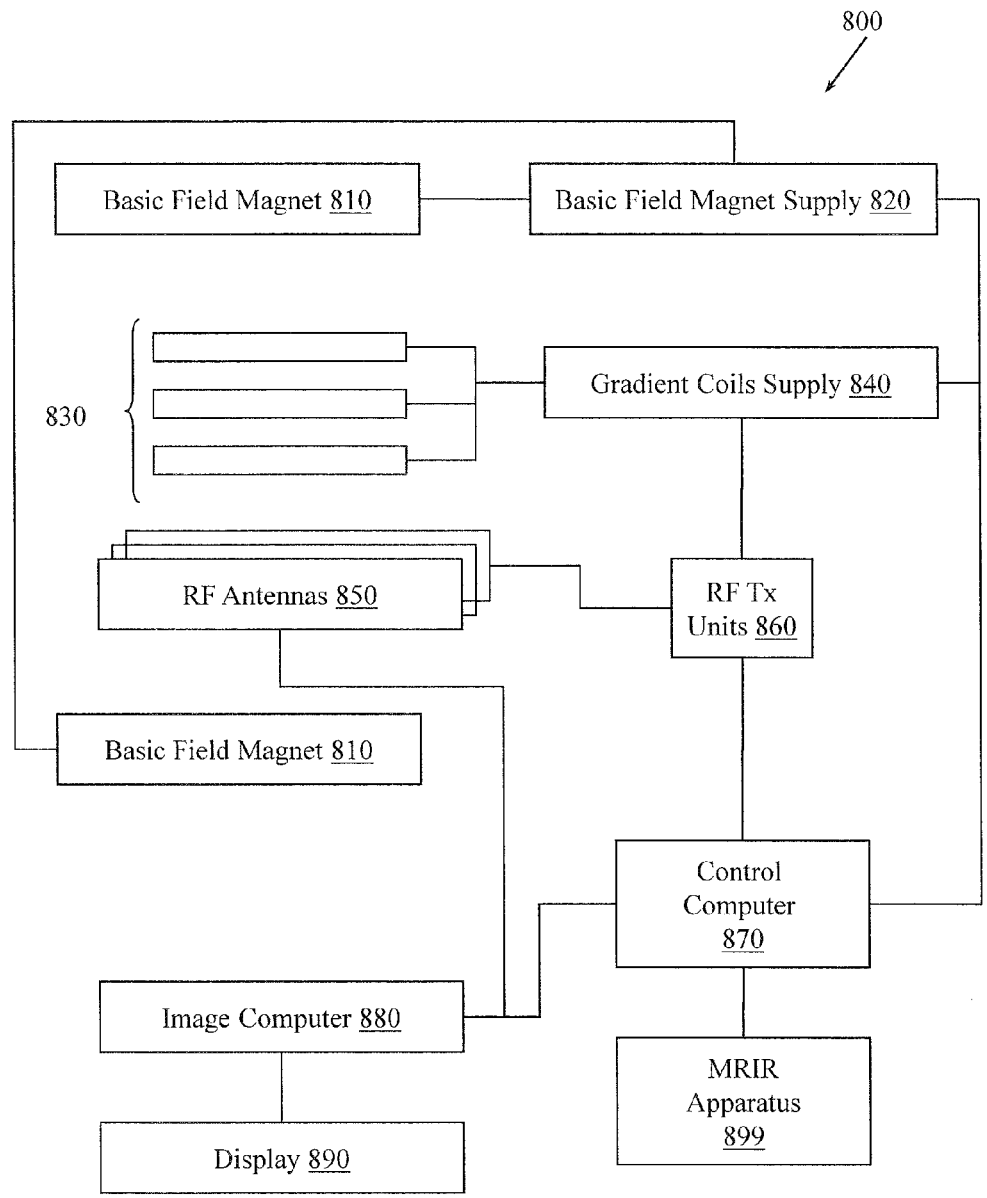
FIG. 8 illustrates an MRI apparatus configured to perform multi-scale OMP for MRIR.

FIG. 8 illustrates an example MRI apparatus 800 configured with an MRIR apparatus 899. The MRIR apparatus 899 may be configured with elements of example apparatus described herein and/or may perform example methods described herein.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MRI procedure.

MRI apparatus 800 may include a set of RF antennas 850 that are configured to generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

While FIG. 8 illustrates an example MRI apparatus 800 that includes various components connected in various ways, it is to be appreciated that other MRI apparatus may include other components connected in other ways.

Figure 9:
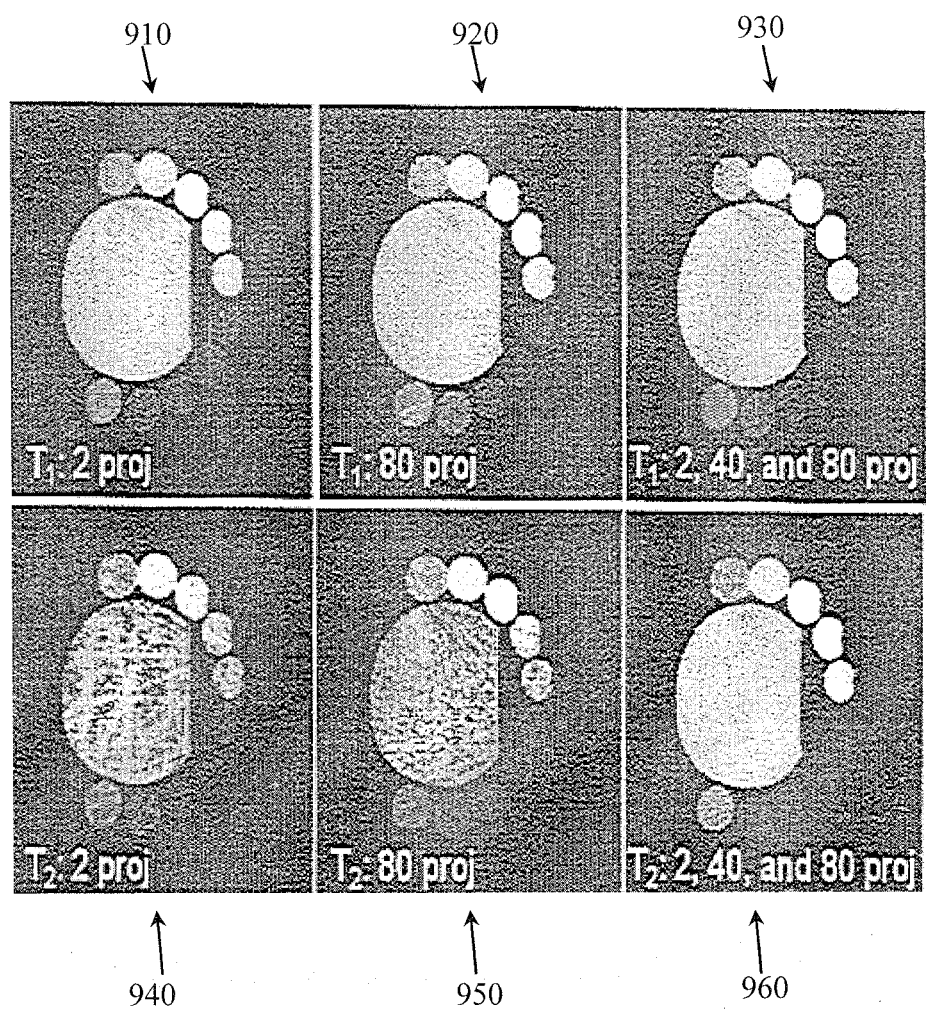
FIG. 9 illustrates T1 and T2 maps of a relaxation phantom generated from IR-TrueFISP data using different types of OMP.

FIG. 9 illustrates T1 and T2 maps of a relaxation phantom generated from IR-TrueFISP data using different types of OMP. Maps 910, 920, and 930 are T1 maps. Maps 940, 950, and 960 are T2 maps. The maps are associated with a relaxation phantom and were generated from IR-TrueFISP data and OMP curve fitting routines. Maps 910 and 940 are images that resulted from fitting using single scale OMP with 2 projections per image. Curve 100 (FIG. 1) was associated with 2 projections per image. Maps 920 and 950 are images that resulted from fitting using single scale OMP with 80 projections per image. Curve 120 (FIG. 1) was associated with 80 projections per image. Errors are seen in maps 910/940 and 920/950. These errors are more pronounced in the T2 maps 940 and 950.

Maps 930 and 960 are images that resulted from fitting using multi-scale OMP based on a concatenation of images having 2, 40, and 80 projections per image. Curve 130 (FIG. 3) is the concatenation of signals associated with images having 2, 40, and 80 projections per image. Maps 930 and 960 exhibit superior parameter homogeneity and higher accuracy as compared to maps 910/940 and 920/950. Maps 930 and 960 appear more homogenous and represent more accurate solution of T1 and T2 values. The superior parameter mapping accuracy may facilitate improved tissue characterization, and for instance, improved tumor detection.

Figure 10:
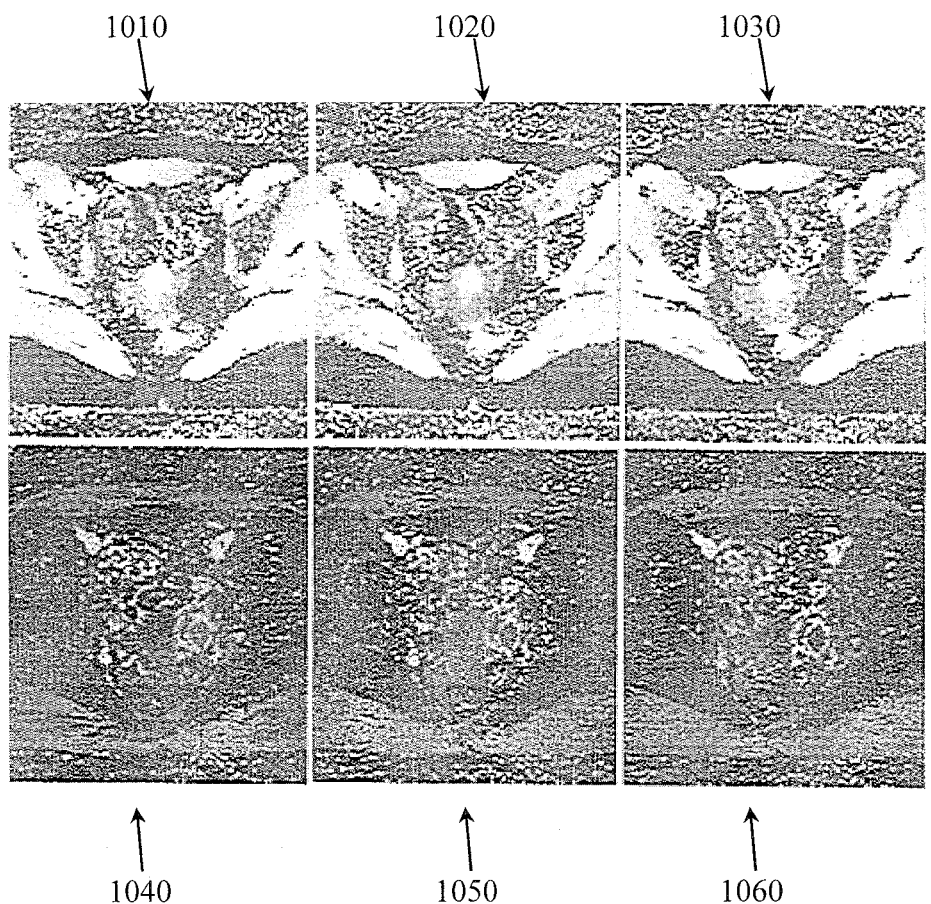
FIG. 10 illustrates T1 and T2 maps generated from IR-TrueFISP data using different types of OMP.

FIG. 10 illustrates T1 and T2 maps generated from IR-TrueFISP data using different types of OMP. Maps 1010, 1020, and 1030 are T1 maps. Maps 1040, 1050, and 1060 are T2 maps. The maps were generated from IR-TrueFISP data acquired from a pelvis. The maps were generated using different OMP curve fitting routines. Maps 1010 and 1040 are images that resulted from fitting using single scale OMP with 2 projections per image. Curve 100 (FIG. 1) was associated with 2 projections per image. Maps 1020 and 1050 are images that resulted from fitting using single scale OMP with 80 projections per image. Curve 120 (FIG. 1) was associated with 80 projections per image. Errors and areas of inhomogeneity within one tissue type are seen in maps 1010/1040 and 1020/1050. These errors are more pronounced in the T2 maps 1040 and 1050.

Maps 1030 and 1060 are images that resulted from fitting using multi-scale OMP based on a concatenation of images having 2, 40, and 80 projections per image. Curve 130 (FIG. 3) is the concatenation of signals associated with images having 2, 40, and 80 projections per image. Maps 1030 and 1060 exhibit superior accuracy for tissue types with fast relaxation parameters (e.g., adipose tissue) as compared to maps 1010/1040 and 1020/1050. Maps 1030 and 1060 appear more homogenous and represent more accurate determination of T1 and T2 values. The improved accuracy is illustrated by the improved homogeneity in fat tissue and reduced noise in muscle tissue.

In one embodiment, IR-TrueFISP with the golden angle radial trajectory can reduce the scan time needed to acquire data for simultaneous T1 and T2 quantification to less than 6 seconds per slice. Conventional quantification based on the data acquired using this approach and trajectory has suffered when the initial portions of a relaxation curve have not contained information sufficient to facilitate highly disambiguating pattern matching. Insufficient information may be present, for example, when tissues with fast relaxation (e.g., fat) are present. Conventional OMP can only partially address this issue due to the lack of information in overly homogenous comparative curves.

Example apparatus and methods described herein rely on a dictionary that has derived curves representing combined signal evolutions. The derived curves are designed to improve OMP by facilitating more accurate disambiguation of input signals. In one example, a combined signal evolution is analyzed in light of a dictionary of similarly combined signal evolutions. Since the combined signal evolutions have more information than conventional signal evolutions, the comparison may lead to improved matching and disambiguation.

FIGS. 9 and 10 illustrate that in one embodiment, multi-scale OMP performed on data acquired using IR-TrueFISP yields more accurate quantification of relaxation parameters when compared to single scale OMP. In one embodiment, the improved accuracy can be achieved even for acquisitions performed in less than six seconds per slice and even for acquisitions involving materials having widely varying T1 and T2 values.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 11:
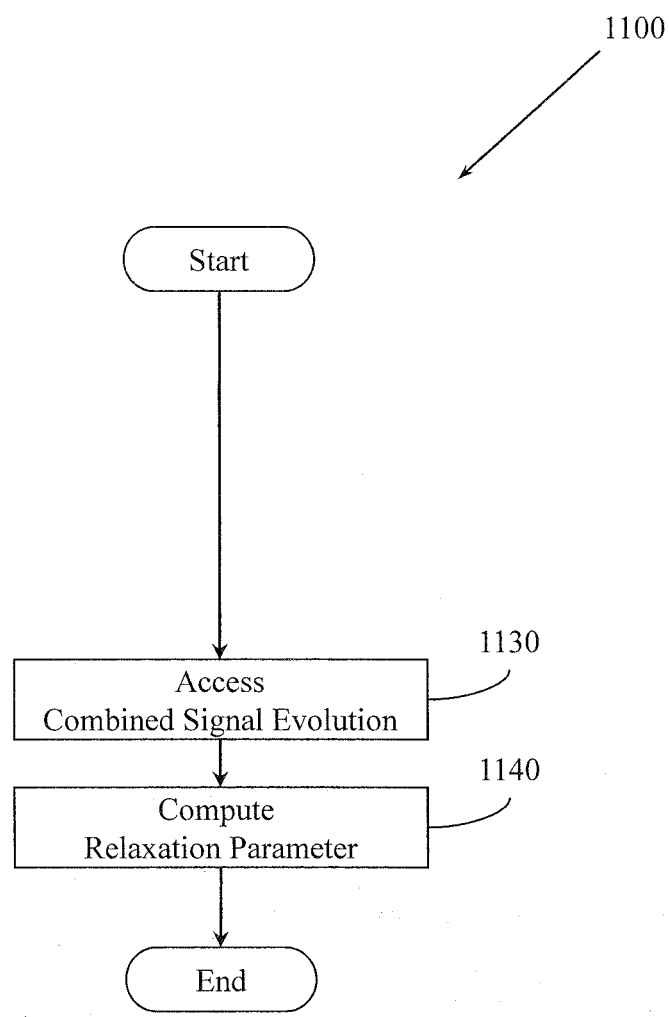
FIG. 11 illustrates an example method associated with multi-scale OMP for MRIR.

FIG. 11 illustrates a method 1100 associated with performing relaxometry. In one embodiment, method 1100 performs multi-scale OMP for MRIR. Method 1100 includes, at 1130, accessing a combined signal evolution associated with relaxation of nuclei in an item that has experienced NMR excitation. The combined signal evolution will have been built from relaxation information present in a first series of MR images of the item and in a second series of MR images of the item. Unlike conventional systems, the first series of MR images will have a first scale and the second series of MR images will have a second, different scale. For example, the first series of MR images may be crafted using a first number of projections (e.g., 16) while the second series of MR images may be crafted using a second number of projections (e.g., 64). For other embodiments, other scales may include, for example, an NMR excitation approach, an NMR excitation trajectory, and a degree of under-sampling. The series of MR images will have been acquired from the item after NMR excitation.

The combined signal evolution may have been produced using different combinatorial approaches. In one example, the combined signal evolution may be a concatenation of a first signal evolution associated with the first series of MR images and a second, different signal evolution associated with the second series of MR images. In another example, the combined signal evolution is a registration of a first signal evolution associated with the first series of MR images and a second signal evolution associated with the second series of MR images.

Method 1100 may also include, at 1140, controlling a computer to compute a value for an NMR relaxation parameter for the item. In one example, the computing is based on a computerized matching of the combined signal evolution to a set of combined comparative signal evolutions. The computerized matching may be, for example, an OMP matching. In different examples, the NMR relaxation parameter can be spin-lattice relaxation (T1), spin-spin relaxation (T2), spin density relaxation (M0), and/or combinations thereof.

Method 1100 may perform faster and more accurate computations of relaxation parameters than conventional approaches. Thus, in one example, method 1100 may complete, including simultaneously computing values for T1, T2, and M0 for the item, in less than six seconds per slice.

While method 1100 has been described accessing a combined signal evolution, in one embodiment, method 1100 may employ parallel processing techniques and simultaneously process multiple different signal evolutions using multiple different dictionaries. For example, in one embodiment, method 1100 may include controlling the computer to produce, in parallel, a first combined signal evolution associated with the first series of MR images and the second series of MR images and a second, different combined signal evolution associated with a second, different combination of the first series of MR images and the second series of MR images. With the two different combined signal evolutions available, in one embodiment method 1100 may include controlling the computer to perform two different OMP matches in parallel. A first OMP match may compare the first combined signal evolution to a first dictionary and a second OMP match may compare the second combined signal evolution to a second dictionary. The first dictionary will include combined comparative signal evolutions related to the first combination and the second dictionary will include combined comparative signal evolutions related to the second combination.

Figure 12:
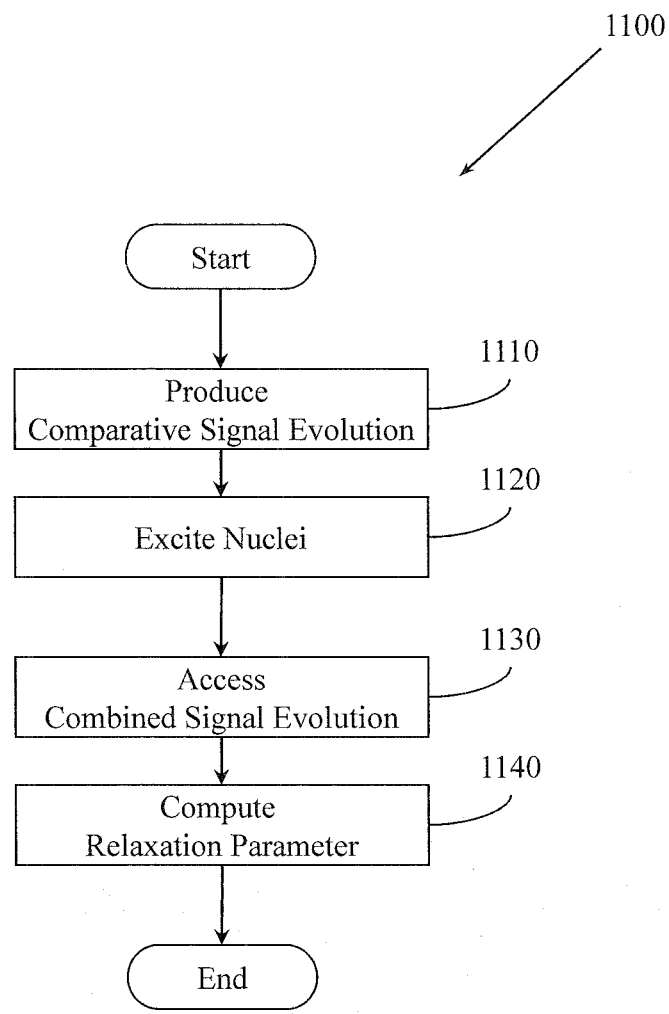
FIG. 12 illustrates an example method associated with multi-scale OMP for MRIR.

FIG. 12 illustrates another embodiment of method 1100. This embodiment includes actions 1130 and 1140 as well as actions 1110 and 1120.

This embodiment includes, at 1110, controlling the computer to produce the set of combined comparative signal evolutions. The combined comparative signal evolutions may be fashioned from, for example, previously acquired signal evolutions, simulated signal evolutions, and so on. In one embodiment, the computer may be controlled to continue to produce the set of combined comparative signal evolutions until a desired degree of heterogeneity between combined comparative signal evolutions exceeds a desired heterogeneity threshold. The heterogeneity threshold may be related to the information content found in different parts of combined comparative curves.

This embodiment also includes, at 1120, controlling an NMR apparatus to cause the NMR excitation in the item. The NMR excitation may be caused, in one example, in response to an inversion recovery true fast imaging with steady state precession (IR-TrueFISP) excitation.

In one example, instructions for controlling a computer to perform a method may be stored on a non-transitory computer-readable medium. The instructions, when executed by a computer, control the computer to perform methods described herein (e.g., method 1100). In one embodiment, the non-transitory computer readable medium may store instructions for performing a method that includes controlling an NMR apparatus to cause selected nuclei in an item to resonate by applying RF energy to the item. The method may also include controlling the NMR apparatus to produce a first series of MR images of the item. The first series of MR images will have a first scale (e.g., quantity of k-space data points per image, number of projections). The method may also include controlling the NMR apparatus to produce a second series of MR images of the object. The second series of MR images will have a second, different scale (e.g., different quantity of k-space data points per image, different number of projections). While the example scale concerns quantity of k-space data points per image or numbers of projections, one skilled in the art will appreciate that other scales may be employed.

In one embodiment, the method 1100 may also include controlling the NMR apparatus to produce a combined signal evolution from a first signal evolution associated with the first series of MR images and a second signal evolution associated with the second series of MR images. The combination may be, for example, a concatenating, an appending, a pre-pending, a registration, and so on.

In one embodiment, the method 1100 may also include controlling the NMR apparatus to characterize relaxation of the selected nuclei in the item as a function of a matching (e.g., OMP) that compares the combined signal evolution to a set of combined comparative signal evolutions. The combined comparative signal evolutions will be relevant to the approach used for combining signal evolutions to produce the combined signal evolution.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
   accessing a combined signal evolution associated with relaxation of nuclei in an item that has experienced nuclear magnetic resonance (NMR) excitation, where relaxation information from which the combined signal evolution is derived is present in a first series of magnetic resonance (MR) images of the item and in a second series of MR images of the item, the first series of MR images having a first scale and the second series of MR images having a second, different scale, and where the first series of MR images and the second series of MR images were acquired from the item after the NMR excitation; and controlling a computer to compute a value for an NMR relaxation parameter for the item, where the computing is based on a computerized matching of the combined signal evolution to a set of combined comparative signal evolutions.

2. The method of claim 1, the computerized matching being an orthogonal matching pursuit (OMP) matching.

3. The method of claim 1, the NMR relaxation parameter being one or more of, spin-lattice relaxation (T1), spin-spin relaxation (T2), and spin density relaxation (M0).

4. The method of claim 1, where the combined signal evolution is a concatenation of a first signal evolution associated with the first series of MR images and a second, different signal evolution associated with the second series of MR images.

5. The method of claim 1, where the combined signal evolution is a registration of a first signal evolution associated with the first series of MR images and a second signal evolution associated with the second series of MR images.

6. The method of claim 1, comprising controlling an NMR apparatus to cause the NMR excitation in the item in response to an inversion recovery true fast imaging with steady state precession (IR-TrueFISP) excitation.

7. The method of claim 1, where the first scale and the second scale are related to a quantity of k-space data points per image.

8. The method of claim 1, where the first scale and the second scale are associated with one or more of, an NMR excitation approach, an NMR excitation trajectory, and a degree of under-sampling.

9. The method of claim 1, comprising:
controlling the computer to produce the set of combined comparative signal evolutions from one or more of, a previously acquired signal evolution, and a simulated signal evolution.

10. The method of claim 9, comprising:
controlling the computer to produce the set of combined comparative signal evolutions until a desired degree of heterogeneity between combined comparative signal evolutions exceeds a desired heterogeneity threshold.

11. The method of claim 3, comprising:
controlling the computer complete the method in less than six seconds per slice, including simultaneously computing values for T1, T2, and M0 for the item in less than six seconds per slice.

12. The method of claim 1, comprising:
controlling the computer to produce a first combined signal evolution associated with a first combination of the signal evolutions associated with the first series of MR images and the second series of MR images;
controlling the computer to produce a second, different combined signal evolution associated with a second, different combination of the signal evolutions associated with the first series of MR images and the second series of MR images;
controlling the computer to perform two different OMP matches in parallel, where a first OMP match compares the first combined signal evolution to a first dictionary and where a second OMP match compares the second combined signal evolution to a second dictionary,
where the first dictionary includes combined comparative signal evolutions related to the first combination and the second dictionary includes combined comparative signal evolutions related to the second combination.

13. A nuclear magnetic resonance (NMR) apparatus, comprising:
an acquisition logic configured to acquire a first series of MR images having a first scale and to acquire a second series of MR images having a second, different scale, the first series of MR images and the second series of MR images being acquired in response to NMR excitation of an item;
a signal evolution logic configured to produce a combined signal evolution, where the combined signal evolution represents a first signal evolution associated with the relaxation of nuclei as identified in the first series of images and a second signal evolution associated with the relaxation of nuclei as identified in the second series of images; and
a matching logic configured to compute a value for an NMR parameter for the item by comparing the combined signal evolution to a set of combined comparative signal evolutions.

14. The NMR apparatus of claim 13, where the first scale and the second scale concern one or more of, a number of projections per image, a degree of under-sampling, and an NMR signal acquisition strategy.

15. The NMR apparatus of claim 13, where the NMR parameter is one or more of, spin-lattice relaxation (T1), spin-spin relaxation (T2), spin density relaxation (M0), chemical shift, off-resonance, flow, perfusion, diffusion, motion, and uptake of biomarkers.

16. The NMR apparatus of claim 13, where the signal evolution logic is configured to produce the combined signal evolution from a combination of a first signal evolution associated with the first series of images and a second signal evolution associated with the second series of images, the combination being one of, a concatenation of the first signal evolution and the second signal evolution, and a registration of the first signal evolution and the second signal evolution.

17. The NMR apparatus of claim 13, comprising:
an excitation logic configured to perform NMR excitation of the item.

18. The NMR apparatus of claim 13, the matching logic being configured to perform an orthogonal matching pursuit (OMP) matching.

19. A non-transitory computer-readable medium storing computer executable instructions that when executed by a computer control the computer to perform a method, the method comprising:
controlling a nuclear magnetic resonance (NMR) apparatus to cause selected nuclei in an item to resonate by applying radio frequency (RF) energy to the item;
controlling the NMR apparatus to produce a first series of magnetic resonance (MR) images of the item, the first series of MR images having a first scale;
controlling the NMR apparatus to produce a second series of MR images of the object, the second series of MR images having a second, different scale;
controlling the NMR apparatus to produce a combined signal evolution from a first signal evolution associated with the first series of MR images and a second signal evolution associated with the second series of MR images; and controlling the NMR apparatus to characterize relaxation of the selected nuclei in the item as a function of an orthogonal matching pursuit (OMP) that compares the combined signal evolution to a set of combined comparative signal evolutions.

* * * * *

UNITED STATES PATENT AND TRADEMARK OFFICE
CERTIFICATE OF CORRECTION

PATENT NO.        : 8,558,546 B2                                             Page 1 of 1
APPLICATION NO.   : 13/085690
DATED             : October 15, 2013
INVENTOR(S)       : Griswold et al.

It is certified that error appears in the above-identified patent and that said Letters Patent is hereby corrected as shown below:

In the Claims

Claim 11:

In column 13, line 52 delete "computer complete" and insert --computer to complete--.

Signed and Sealed this
Twentieth Day of May, 2014

Michelle K. Lee
*Deputy Director of the United States Patent and Trademark Office*